United States Patent [19]

Fujii et al.

[11] Patent Number: 4,574,255

[45] Date of Patent: Mar. 4, 1986

[54] MMC SUBSTRATE INCLUDING CAPACITORS HAVING PEROVSKITE STRUCTURE DIELECTRIC AND ELECTRICAL DEVICES INCLUDING MMC SUBSTRATE

[75] Inventors: Shuzo Fujii; Yuzo Shimada; Kazuaki Utsumi; Yutaka Saito, all of Tokyo, Japan

[73] Assignee: NEC Corporation, Tokyo, Japan

[21] Appl. No.: 561,506

[22] Filed: Dec. 15, 1983

[30] Foreign Application Priority Data

| Dec. 15, 1982 | [JP] | Japan | 57-219753 |
| Feb. 8, 1983 | [JP] | Japan | 58-19201 |
| Feb. 25, 1983 | [JP] | Japan | 58-30308 |
| Feb. 25, 1983 | [JP] | Japan | 58-30309 |
| Mar. 15, 1983 | [JP] | Japan | 58-42576 |
| Mar. 16, 1983 | [JP] | Japan | 58-43461 |
| Mar. 16, 1983 | [JP] | Japan | 58-43462 |
| Mar. 16, 1983 | [JP] | Japan | 58-43482 |
| Mar. 22, 1983 | [JP] | Japan | 58-47449 |
| Apr. 4, 1983 | [JP] | Japan | 58-57856 |

[51] Int. Cl.$^4$ .............. H03L 7/06; H03L 1/02; H03B 5/36; G01K 7/32
[52] U.S. Cl. ..................... 331/25; 331/49; 331/66; 331/68; 331/69; 331/70; 331/116 R; 331/158; 331/161; 331/176; 331/177 V; 331/DIG. 3; 361/412; 361/414; 501/134
[58] Field of Search ............. 331/25, 49, 66, 68, 331/69, 70, 116 R, 116 M, 154, 156, 158, 161, 176, 177 V, DIG. 3; 361/221, 222, 412, 414; 501/134, 136

[56] References Cited

U.S. PATENT DOCUMENTS

| 3,701,958 | 10/1972 | Jaag | 361/414 X |
| 4,121,941 | 10/1978 | Kawashima et al. | 501/135 |
| 4,216,102 | 8/1980 | Furukawa et al. | 501/134 X |
| 4,216,103 | 8/1980 | Fujiwara et al. | 501/134 X |
| 4,241,378 | 12/1980 | Dorrian | 361/322 X |
| 4,265,668 | 5/1981 | Fujiwara et al. | 501/134 |
| 4,485,180 | 11/1984 | Konoike et al. | 361/321 X |

Primary Examiner—Eugene R. LaRoche
Assistant Examiner—D. C. Mis
Attorney, Agent, or Firm—Sughrue, Mion, Zinn, Macpeak, and Seas

[57] ABSTRACT

Between insulative layers (31–37, 41–44), a multilayer substrate comprises at least one dielectric layer (26–29). It is possible to form capacitors (58), resistors (46), and wiring conductors (61, 62) in the substrate. The at least one dielectric layer should be of at least one dielectric composition which has a perovskite structure. Preferably, each insulative layer is of an insulating material which consists essentially of aluminum oxide and lead borosilicate glass. The substrate is convenient in manufacturing a crystal oscillator by mounting a crystal vibrator (71) and a transistor (72) on the principal surface(s). Examples of the dielectric composition are:

$$Pb[(Fe_{\frac{2}{3}}.W_{\frac{1}{3}})_{0.33}(Fe_{\frac{1}{2}}.Nb_{\frac{1}{2}})_{0.67}]O_3,$$

$$Pb[(Mn_{\frac{1}{3}}.Nb_{\frac{2}{3}})_{0.01}(Mg_{\frac{1}{3}}.W_{\frac{1}{3}})_{0.30}(Ni_{\frac{1}{3}}.Nb_{\frac{2}{3}})_{0.49}Ti_{0.20}]O_3,$$

and $$Pb[(Mg_{\frac{1}{2}}.W_{\frac{1}{2}})_{0.66}Ti_{0.34}]O_3.$$

37 Claims, 22 Drawing Figures

FIG. 8
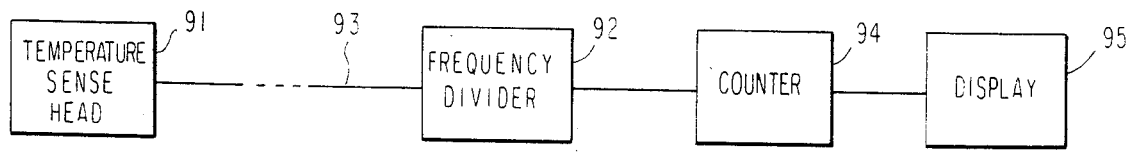
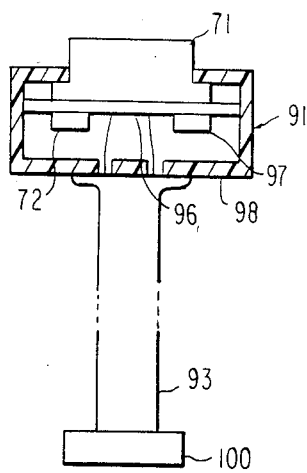
FIG. 9
FIG. 10
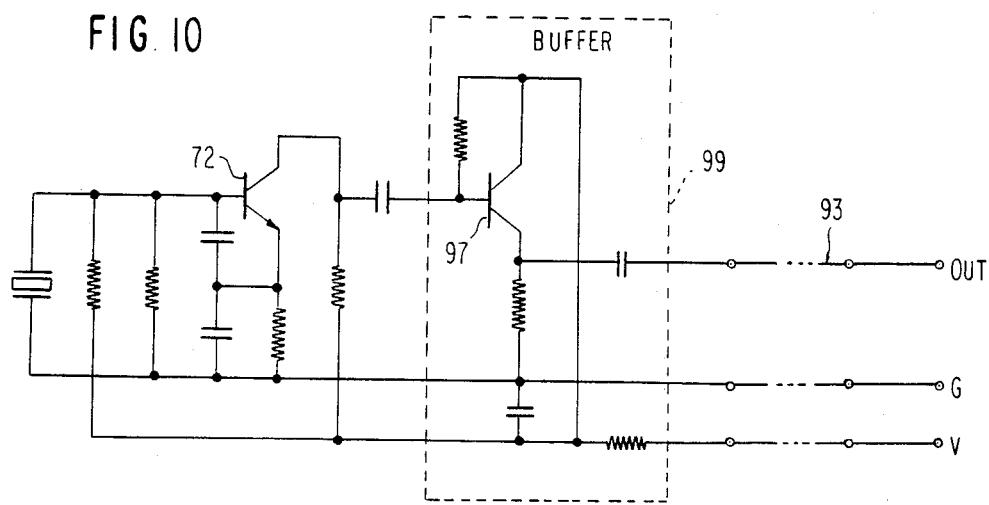

MMC SUBSTRATE INCLUDING CAPACITORS HAVING PEROVSKITE STRUCTURE DIELECTRIC AND ELECTRICAL DEVICES INCLUDING MMC SUBSTRATE

BACKGROUND OF THE INVENTION

This invention primarily relates to a multilayer substrate including resistors, capacitors, and wiring conductors therefor. A substrate of this type is herein called a monolithic multicomponents ceramic (MMC) substrate and is useful in, among others, manufacturing a piezoelectric oscillator, which may be a crystal oscillator.

Multilayer ceramic substrate including resistors, are already known. Such a substrate is manufactured by laminating a plurality of insulative green sheets and then firing or sintering the green sheets into an integral body of ceramic layers. Resistive and conductive patterns are preliminarily printed or otherwise formed on predetermined ones of the green sheets. When fired, the patterns become resistive and conductive films between the ceramic layers. The resistive and the conductive films serve as resistors and conductors for electrical connection thereto. Connection between the resistors or conductors on different ceramic layers is provided by conductive masses filled in via holes preliminarily formed through preselected ones of the green sheets. The conductors of the patterns and the conductive masses are herein referred to either singly or collectively as wiring conductors, which form an electrical circuit together with the resistors. The substrate may be used with a semiconductor chip, such as a silicon semiconductor chip, mounted thereon in electrical connection to the electrical circuit formed therein.

The green sheets have usually been manufactured of alumina. The alumina green sheets must be sintered at a high temperature, such as 1500° C. or above. Even when the sintering is carried out in a reducing atmosphere, the high sintering temperature prohibits use of metals capable of providing fine conductive patterns. It is difficult to form via holes of a small diameter through the alumina green sheets. This makes it impossible to form dense wiring conductors and to render the substrate compact. Furthermore, the ceramic layers have a relatively large dielectric constant of about 10 and an appreciably large thermal expansion coefficient of about $70 \times 10^{-7}$/°C. between room temperature and 250° C. The large dielectric constant results in a long propagation delay. The large thermal expansion coefficient is incompatible with that of the silicon semiconductor chips.

On the other hand, piezoelectric oscillators are more and more widely used as clock generators and timing signal generators in recent communication apparatus as, for example, digital terminal equipment. A conventional piezoelectric oscillator may comprise a ceramic or like substrate and a piezoelectric oscillation element or vibrator, an active semiconductor device, at least one resistor, and at least one capacitor soldered or otherwise connected onto a printed circuit preliminarily formed on the substrate. The piezoelectric oscillation element, active semiconductor device, resistor or resistors, and capacitor or capacitors form an oscillation circuit in cooperation with the printed circuit. The oscillator is therefore bulky. The piezoelectric oscillation element as well as the active and passive circuit elements must be installed on the substrate one by one. Moreover, it is necessary for optimum operation of the oscillator to adjust the passive circuit elements by removing each undesirable element from the printed circuit and afresh installing a new one thereon. Manufacture of conventional piezoelectric oscillators of this type has therefore been time consuming and expensive.

SUMMARY OF THE INVENTION

It is therefore an object of the present invention to provide an MMC substrate, which can be manufactured in a short time.

It is another object of this invention to provide an MMC substrate of the type described, in which it is possible to form an electrical circuit comprising resistors and capacitors in a fine and dense pattern arrangement and which is consequently compact.

It is still another object of this invention to provide an MMC substrate of the type described, wherein it is possible to densely form via holes which pass through a layer of the substrate and filled with conductive masses for use in electrically connecting the resistors and the capacitors formed on different layers of the substrate.

It is yet another object of this invention to provide an MMC substrate of the type described, which is suitable for use in manufacturing a compact and economical piezoelectric oscillator.

Other objects of this invention will become clear as the description proceeds.

According to this invention, there is provided an MMC substrate comprising at least one dielectric layer, a plurality of insulative layers on both sides of the above-mentioned at least one dielectric layer, a plurality of resistive films on at least one of the dielectric and the insulative layers, a plurality of pairs of conductive films on both sides of at least one of the dielectric and the insulative layers, and a plurality of wiring conductors on and through predetermined ones of the dielectric and the insulative layers to form an electrical circuit together with the resistive films and the pairs, wherein the abovementioned at least one dielectric layer is of at least one composition which has a perovskite structure.

BRIEF DESCRIPTION OF THE DRAWING

FIG. 8 is a block diagram of a piezoelectric thermometer which includes an MMC substrate of the type shown in FIG. 1;

FIG. 9 schematically shows, partly in section, a side view of a temperature sensing head of the piezoelectric thermometer illustrated in FIG. 8;

FIG. 10 is a circuit diagram of the temperature sensing head mentioned in conjunction with FIG. 9;

DESCRIPTION OF THE PREFERRED EMBODIMENTS

Figure 1:
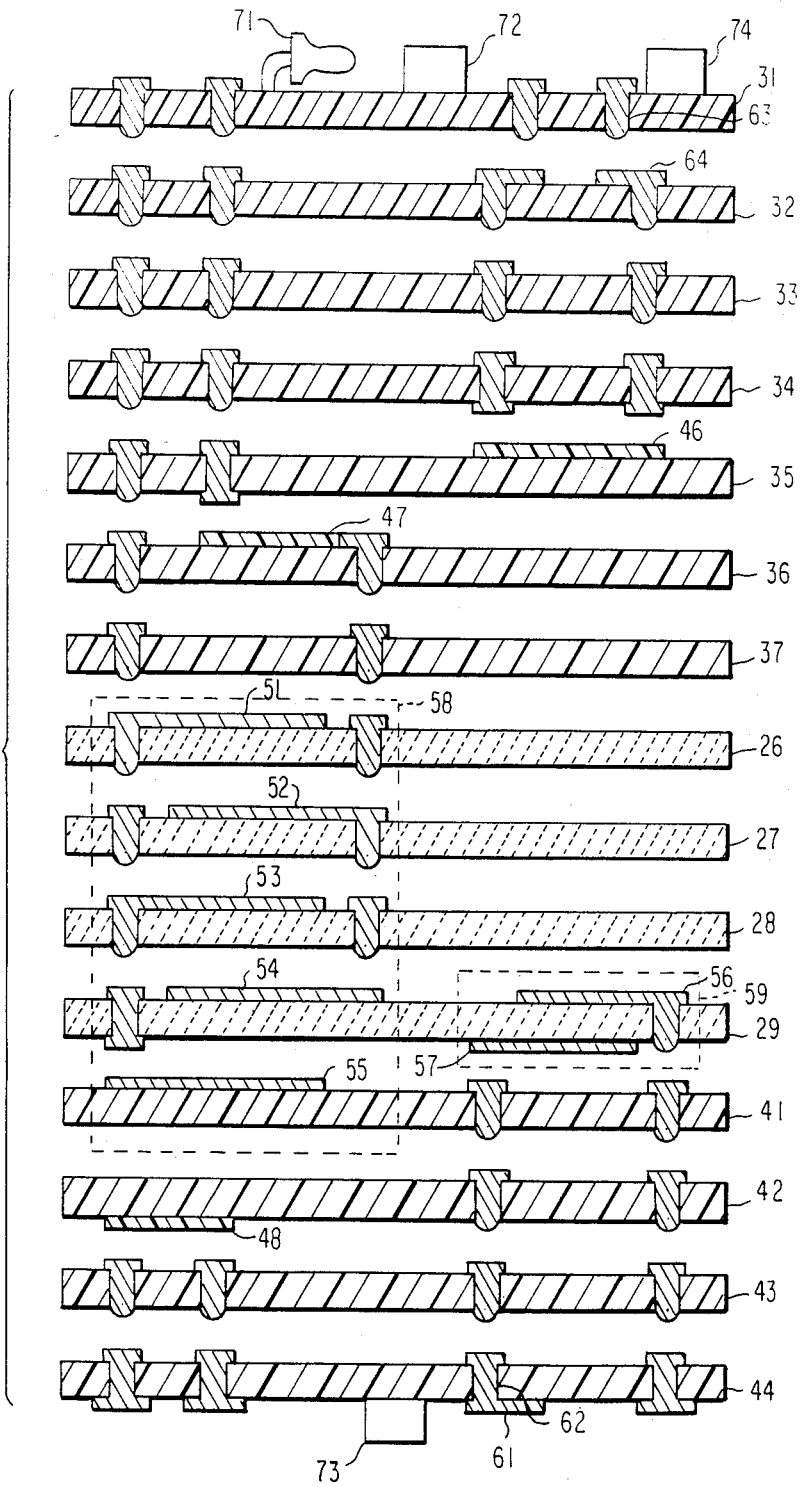
FIG. 1 schematically shows an exploded vertical section of an MMC substrate according to a first embodiment of the instant invention.

Referring to FIG. 1, an MMC substrate according to a first embodiment of the present invention comprises first through fourth dielectric layers 26, 27, 28, and 29, first through seventh insulative layers 31, 32, 33, 34, 35, 36, and 37 of a first group on one side of the first through the fourth dielectric layers 26 to 29, and first through fourth insulative layers 41, 42, 43, and 44 of a second group on the other side of the dielectric layers 26 through 29. Merely for convenience of illustration, each dielectric layer and each insulative layer are represented by hatches of an insulative sheet, respectively. The first first-group and the fourth second-group insulative layers 31 and 44 provide a pair of top and bottom principal surface of the substrate.

A plurality of resistive films are formed on at least one of the dielectric and the insulative layers. In the vertical section, three resistive films 46, 47, and 48 are seen on the insulative layers 35, 36, and 42 with hatches representative of an insulative material used merely for clarity of illustration. The resistive films 46 through 48 serve as resistors 46, 47, and 48 (the same reference numerals being used).

A plurality of pairs of conductive films are formed on both sides of at least one of the dielectric and the insulative layers. By way of example, first through fifth partial conductive films 51, 52, 53, 54, and 55 are formed on the first through the fourth dielectric layers 26 to 29 and on the first second-group insulative layer 41. As will presently be described, the first, third, and fifth partial conductive films 51, 53, and 55 serve collectively as a first conductive film of a pair and the second and fourth partial conductive films 52 and 54, collectively as a second conductive film of the pair. Inasmuch as the layers 26 to 29, 31 to 37, and 41 to 44 are rendered integral, the first and the second conductive films of the pair being illustrated, are formed on both sides of the dielectric layers 26 through 29. Similarly, first and second conductive films 56 and 57 of another pair are formed on both sides of the fourth dielectric layer 29. The pairs serve as large-capacity and small-capacity capacitors 58 and 59 as indicated by dashed-line rectangles.

A plurality of wiring conductors are formed on and/or through predetermined ones of the dielectric and the insulative layers so as to form an electrical circuit together with the resistors, such as 46 through 48, and the capacitors, such as 58 and 59. For example, a conductive film 61 is formed on the bottom principal surface of the fourth second-group insulative layer 44. In integrally electrical contact with the conductive film 61, a conductive mass 62 is formed through the layer 44. The conductive mass 62 fills one of via holes formed through the layer 44. Another conductive mass 63 is formed through the first first-group insulative layer 31. A conductive film 64 is formed on the second first-group insulative layer 32. The first, third, and fifth partial conductive films 51, 53, and 55 are connected altogether by such conductive masses into the first conductive film of the pair which provides the large-capacity capacitor 58. The second and the fourth partial conductive films 52 and 54 are likewise connected into the second conductive film of the pair under consideration. As the case may be, the conductive films formed on at least one of the principal surfaces, such as 61, will be called terminal films.

Figure 2:
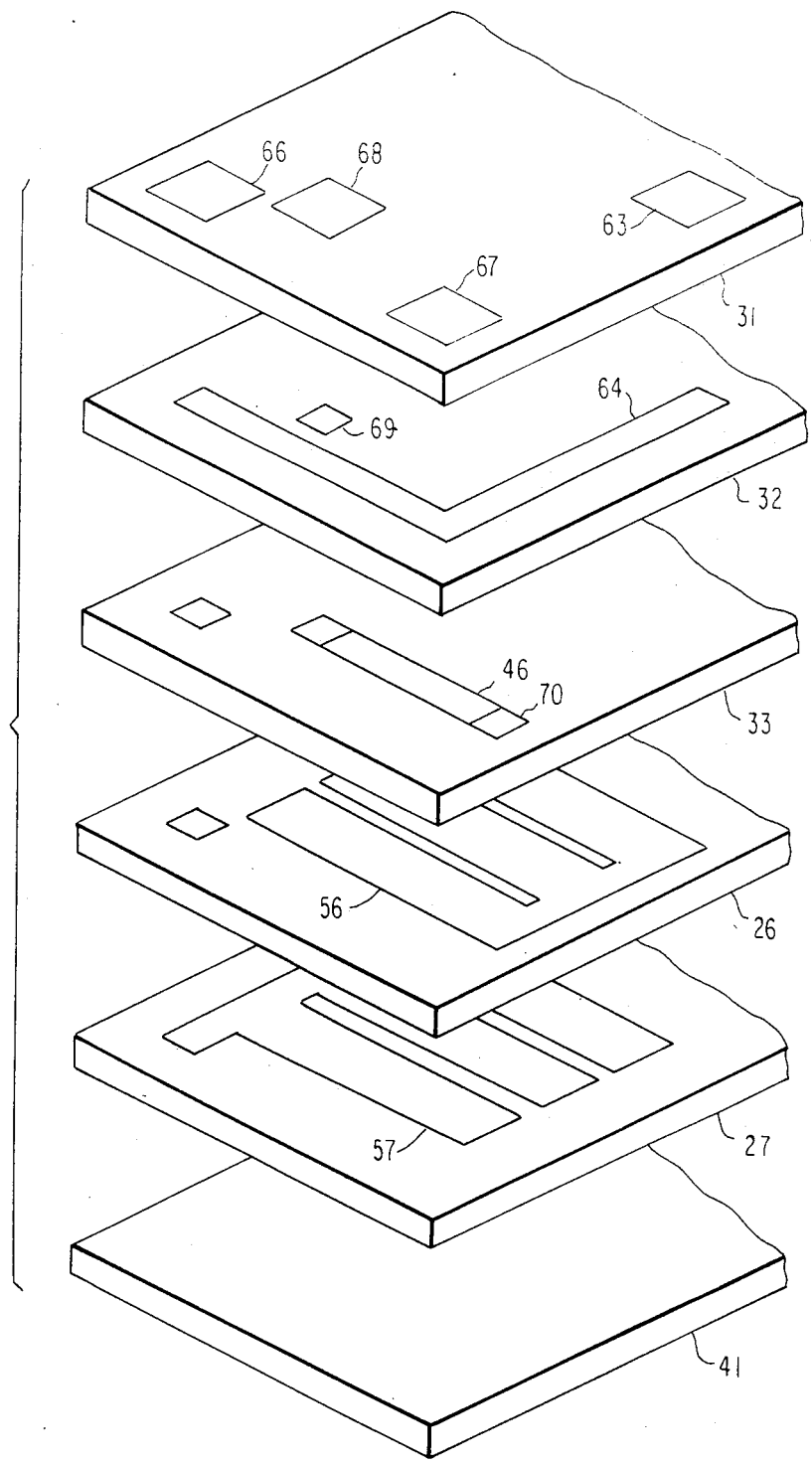
FIG. 2 is an exploded partial schematic perspective view of an MMC substrate according to a second embodiment of this invention.

Turning to FIG. 2, an MMC substrate according to a second embodiment of this invention comprises similar parts designated by like reference numerals. Only first and second dielectric layers 26 and 27 are used together with first through third first-group insulative layers 31 to 33 and a single second-group insulative layer 41.

First and second wiring conductors 66 and 67 formed on and through the first first-group insulative layer 31 are for electrical connection to the conductive film 64 formed on the second first-group insulative layer 32. A third wiring conductor 68 formed on and through the insulative layer 31 is for electrical connection, through a fourth wiring conductor 69 formed on and through the second first-group insulative layer 32 and through a conductive film formed on the third first-group insulative layer 33, to a first end of a resistor 46 formed on the third first-group insulative layer 33. Another wiring conductor 70 is formed on the third first-group insulative layer 33 in electrical contact with a second end of the resistor 46 and through the insulative layer 33 in electrical contact with a first conductive film 56 formed on the first dielectric layer 26 for a capacitor 59. A second conductive film 57 of the capacitor 59 is formed on the second dielectric layer 27 and is connected to the conductive film 64 through wiring conductors which are formed through the first dielectric layer 26 and the third first-group insulative layer 33 as depicted by small squares near the lefthand end of the figure. It should be understood that a conductive mass (not shown) extends from the lefthand end of the conductive film 64 through the second first-group insulative layer 32. Incidentially, the second conductive film 57 is formed on a dielectric layer as described above, rather than on an insulative layer. This is merely for convenience of description.

Reviewing FIGS. 1 and 2, it is possible to connect the terminal films, such as 61, 63 and 66 through 68, of an MMC substrate to a power source and so forth (not shown). For example, a piezoelectric oscillation element or vibrator 71, a transistor 72, a diode 73, and a switch 74 may be soldered or otherwise connected on at least one of the principal surfaces to such terminal films to form an oscillation circuit together with the resistors and the capacitors exemplified at 46 through 48, 58, and 59, as will later be described. It may be mentioned here that one of two electrodes of the piezoelectric oscillation element 71 (FIG. 1) may be connected to the first terminal film 66 (FIG. 2). The base electrode of the transistor 72 may be connected to the second terminal film 67 with the emitter electrode connected to the third terminal film 68.

EXAMPLE I

In order to manufacture dielectric green sheets, lead oxide (PbO) powder, ferric oxide ($Fe_2O_3$) powder, niobium oxide ($Nb_2O_3$) powder, and tungsten oxide ($WO_3$) powder were weighed and wet mixed in a ball mill to provide an oxide powder mixture. After filtered and dried, the oxide powder mixture was presintered at a temperature between 700° C. and 800° C. and then ground in a ball mill into a presintered and ground mixture. A dielectric slurry was prepared by mixing the presintered and ground mixture with an organic vehicle which consists essentially of an organic solvent or water, an organic binder, and an organic plasticizer. The organic solvent may be ethylene glycol monoethyl ether, usually known in the art by a trade name of ethyl cellosolve, diethylene glycol mono-n-butyl ether, known by a trade name of butyl carbitol, petroleum naphtha,α-terpineol, tetrahydrofurfuryl alcohol, isopropyl ether, diethylene glycol monoethyl ether acetate, dipropylene glycol, xylene, or toluene. The organic binder may be polyvinyl butylal, polyvinyl alcohol, polyvinyl ether, polyvinyl chloride, or ethylcelluose. The organic plasticizer may be BPBG (butyl phthalyl-butyl glycolate), tricresyl phosphate, tributyl phosphate, butyl benzyl phthatate, ortriethylene glycol.

By resorting to a known film forming method of the slip casting type, such as the doctor blade process, the dielectric slurry was cast on a polyester film into a dielectric film of a thickness between 10 microns and 200 microns. After pealed off, the dielectric film was punched by a punch and die into the dielectric green sheets of a predetermined size, such as 120 mm square. As will shortly be described, the dielectric green sheets were fired into dielectric layers of an MMC substrate. When the oxides are weighed to provide dielectric layers of a perovskite structure of a dielectric composition represented by:

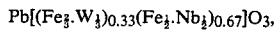

it was possible to fire the dielectric green sheets at about 950° C. The dielectric layers had a dielectric constant of about 18,000.

For manufacture of insulative green sheets, a ceramic mixture was prepared by wet mixing aluminium oxide powder and crystallized lead borosilicate glass powder in a ball mill. An insulative slurry was prepared by mixing the ceramic mixture with the organic vehicle of the type described above. As described in conjunction with the dielectric green sheets, the insulative green sheets were manufactured of the insulative slurry. Each insulative green sheet had a thickness between 20 microns and 300 microns. The constituent ranges were selected from 40 to 60 percent by weight for the aluminium oxide powder and 40 to 60 percent by weight for the crystallized lead borosilicate glass powder so as to become 100 percent in total. The crystallized lead borosilicate glass may essentially consist of, when represented as oxides, lead oxide of 3 to 65 percent, boron oxide of 2 to 50 percent, silicon dioxide of 4 to 65 percent, at least one oxide of elements of Group II of 0.1 to 50 percent, and at least one oxide of elements of Group IV (except carbon, silicon, and lead) of 0.02 to 20 percent, with the constituent ranges selected so as to become 100 percent in total. All percentages are by weight.

It was possible to fire the insulative green sheets at about 900° C. into insulative layers of an MMC substrate. It has been confirmed that the insulative layers have a thermal expansion coefficient of about $42 \times 10^{-7}$/°C. between room temperature and 250° C., a flexural strength of about 3,000 kg/cm$^2$, and a dielectric constant of about 7.5 between 100 Hz and 1 MHz. The thermal expansion coefficient is sufficiently compatible with that of silicon semiconductor chips.

A resistive paste was prepared by kneading powder of a resistive material with an organic vehicle in a roll mill according to the process known in the art. The resistive paste is convenient in providing a relatively high resistivity.

A conductive paste was likewise prepared by using metal or alloy powder. Due to the low firing temperature of the composition and the material of the dielectric and the insulative green sheets, it is possible to use gold, silver, palladium, and/or platinum or an alloy thereof as, for example, silver-palladium known in the art.

Via holes were punched by a punch and die through the dielectric and the insulative green sheets. The via holes may have as small a diameter as 80 microns and as high a density as 110,000 holes in an area of 100 mm square. The conductive and the resistive pastes were screen printed on the green sheets to provide printed sheets. The conductive paste fills the via holes and somewhat protrudes therethrough. The printed sheets were stacked at a temperature of about 110° C. and under a pressure of about 250 kg/cm$^2$ into a lamination. It is preferred that alignment holes be punched through the green sheets concurrently with the via holes for use in attaining register of the printed sheets in the lamination. The lamination was cut into a predetermined size and then fired in air or in a neutral atmosphere at about 950° C. into an MMC substrate.

EXAMPLE II

In order to manufacture resistive green sheets, ruthenium dioxide powder and the crystallized lead borosilicate glass powder used in Example I were mixed to provide a resistive mixture. A resistive slurry was prepared by mixing the resistive mixture with an organic vehicle. By using the resistive slurry, the resistive green sheets of a thickness between 20 microns and 200 microns were manufactured like the dielectric and the insulative green sheets. The composition ratio of the ruthenium dioxide powder to the glass powder was selected from ranges between 10:90 and 50:50 by weight to provide desired resistivities. It is preferred to use butyl butylphthalylate as the organic plasticizer in the organic vehicle.

An MMC substrate was manufactured as in Example I, except that the resistive green sheets were used instead of the resistive paste with the resistive green sheets out into resistive sheet pieces of predetermined shapes and put on the insulative and/or the dielectric green sheets under pressure and in contact with printed films of the conductive paste to provide the resistors in the substrate. The resistive green sheet is convenient on providing a relatively high resistivity.

EXAMPLE III

Dielectric green sheets were manufactured with zinc oxide powder used in addition to the oxide powders used in Example I. When the oxide powders were weighed to provide dielectric layers of a perovskite structure of a dielectric composition given by:

$$Pb[(Fe_{\frac{2}{3}}.W_{\frac{1}{3}})_{0.36}(Fe_{\frac{1}{2}}.Nb_{\frac{1}{2}})_{0.48}(Zn_{\frac{1}{3}}.Nb_{\frac{2}{3}})_{0.16}]O_3,$$

it was possible to fire the dielectric green sheets at about 890° C. into the dielectric layers. The dielectric constant was about 14,000.

Excellent MMC substrates were manufactured as in Examples I and II.

EXAMPLE IV

Dielectric green sheets were manufactured with manganese oxide powder and titatium oxide powder used in addition to the oxide powders used in Example I. When the oxide powder were weighed to provide dielectric layers of a provskite structure of a dielectric composition of:

$$Pb[(Fe_{\frac{2}{3}}.W_{\frac{1}{3}})_{0.85}(Mn_{\frac{1}{3}}.Nb_{\frac{2}{3}})_{0.03}Ti_{0.12}]O_3,$$

it was possible to fire the dielectric green sheets at about 920° C. into the dielectric layers. The dielectric constant was about 2,700.

MMC substrates were manufactured as in Examples I and II with excellent results.

EXAMPLE V

Dielectric green sheets were manufactured by the use of lead oxide powder, magnesium oxide powder, niobium oxide powder, manganese oxide powder, titanium oxide powder, and nickel oxide powder in place of the oxide powders used in Example I. When the oxide powders were weighed to provide dielectric layers of a perovskite structure of a dielectric composition given by:

$$Pb[(Mn_{\frac{1}{3}}.Nb_{\frac{2}{3}})_{0.01}(Mg_{\frac{1}{3}}.Nb_{\frac{2}{3}})_{0.30}(Ni_{\frac{1}{3}}.Nb_{\frac{2}{3}})_{0.49}Ti_{0.20}]O_3,$$

it was possible to fire the dielectric green sheets at about 1050° C. into the dielectric layers. The dielectric constant was about 14,000.

Excellent MMC substrates were manufactured as in Examples I and II.

EXAMPLE VI

Dielectric green sheets were manufactured with tungsten oxide powder in addition to the oxice powders used in Example V. When the oxide powders were weighed to provide dielectric layers of a perovskite structure of a dielectric composition represented by:

$$Pb[(Mn_{\frac{1}{3}}.Nb_{\frac{2}{3}})_{0.005}(Ni_{\frac{1}{3}}.Nb_{\frac{2}{3}})_{0.295}(Mg_{\frac{1}{2}}.W_{\frac{1}{2}})_{0.29}Ti_{0.41}]O_3,$$

it was possible to fire the dielectric green sheets at about 960° C. into the dielectric layers. The dielectric constant was about 10,000.

MMC substrates were manufactured as in Examples I and II with likewise excellent results.

EXAMPLE VII

Dielectric green sheets were manufactured by using zirconium oxide powder instead of the tungsten oxide powder used in Example VI. When the oxide powders were weighed to provide dielectric layers of a perovskite structure of a dielectric composition represented by:

$$Pb[(Mn_{\frac{1}{3}}.Nb_{\frac{2}{3}})_{0.02}(Mg_{\frac{1}{2}}.W_{\frac{1}{2}})_{0.52}Ti_{0.23}Zr_{0.23}]O_3,$$

It was possible to fire the dielectric green sheets at about 1000° C. into the dielectric layers. The dielectric constant was about 3,500.

MMC substrates were manufactured as in Examples I and II with excellent results.

EXAMPLE VIII

Dielectric green sheets were manufactured by using lead oxide powder, magnesium oxide powder, tungsten oxide powder, and titanium oxide powder instead of the oxide powders used in Example I. When the oxide powders were weighed to provide dielectric layers of a perovskite structure of a dielectric composition given by:

$$Pb[(Mg_{\frac{1}{2}}.W_{\frac{1}{2}})_{0.66}Ti_{0.34}]O_3,$$

It was possible to fire the dielectric green sheets at about 900° C. into the dielectric layers. The dielectric constant was about 4,000.

Excellent MMC substrates were manufactured as in Examples I and II.

EXAMPLE IX

Dielectric green sheets were manufactured by using manganese oxide powder and niobium oxide powder in addition to the oxide powders used in Example VIII. When the oxide powders were weighed to provide dielectric layers of a perovskite structure of a dielectric composition of:

$$Pb[(Mg_{\frac{1}{2}}.W_{\frac{1}{2}})_{0.65})Mn_{\frac{1}{3}}.Nb_{\frac{2}{3}})_{0.01}Ti_{0.34}]O_3,$$

it was possible to fire the dielectric green sheets at about 900° C. into the dielectric layers. The dielectric constant was about 3,800.

MMC substrates were manufactured as in Examples I and II with excellent results.

EXAMPLE X

Dielectric green sheets were manufactured with zirconium oxide powder used in addition to the oxide powders used in Example VIII. When the oxide powders were weighed to provide dielectric layers of a perovskite structure of a dielectric composition represented by:

$$Pb[(Mg_{\frac{1}{3}}W_{\frac{1}{3}})_{0.54}Ti_{0.23}Zr_{0.23}]O_3,$$

it was possible to fire the dielectric green sheets at about 1000° C. into the dielectric layers. The dielectric constant was about 1,800.

MMC substrates were manufactured as in Examples I and II with likewise excellent results.

EXAMPLE XI

Dielectric green sheets were manufactured with nickel oxide powder and niobium oxide powder used in addition to the oxide powders used in Example VIII. When the oxide powders were weighed to provide dielectric layers of a perovskite structure of a dielectric composition given by:

$$Pb[(Mg_{\frac{1}{3}}W_{\frac{1}{3}})_{0.24}(Ni_{\frac{1}{3}}Nb_{\frac{2}{3}})_{0.40}Ti_{0.36}]O_3,$$

it was possible to fire the dielectric green sheets at about 990° C. into the dielectric layers. The dielectric constant was about 6,000.

MMC substrates were manufactured as in Examples I and II. The results were excellent.

Reviewing Examples I through XI thus far described, it is understood that the dielectric layers of an MMC substrate may have different dielectric constants. This provides capacitors of considerably different capacities even without much varying the electrodes areas and/or the thickness of the dielectric layers. When a conductive film pair is formed on both sides of an insulative layer as described before, it is possible to form a capacitor of a very small capacity. Depending on the arrangement of capacitors in an MMC substrate, the at least one dielectric layer (such as 26 to 28 of FIG. 1) and at least one additional dielectric layer may be used in the substrate with at least one insulative layer (such as 37 or 41) interposed.

Figure 3:
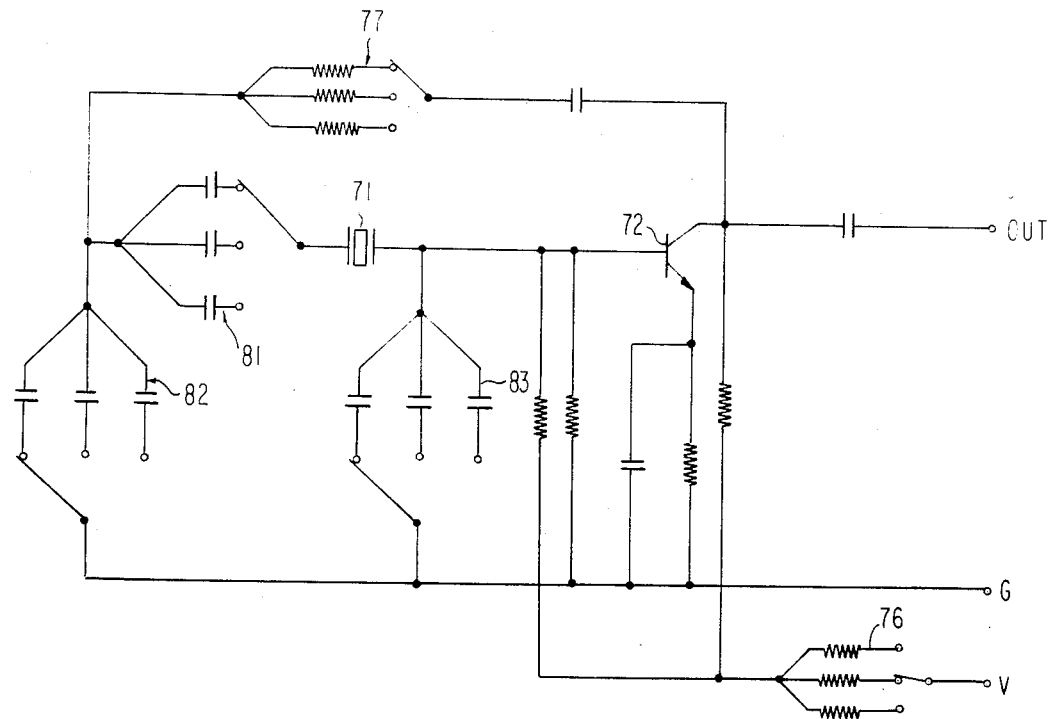
FIG. 3 is a circuit diagram of a piezoelectric oscillator which is conveniently manufactured by the use of an MMC substrate of the type shown in FIG. 1.

Referring now to FIG. 3, it is possible to manufacture a piezoelectric oscillator by the use of an MMC substrate of the type described heretobefore. As has already been described in connection with FIG. 1, a piezoelectric oscillation element or vibrator 71 and a transistor 72 are connected on at least one of the principal surfaces of the substrate to terminal films formed thereon. Three of other films are used as an output terminal OUT, a grounding terminal G, and a power supply terminal V connected to a power source (not shown). Discrete resistors and capacitors, resistor and capacitor groups, and wiring conductors are formed in the substrate.

In the example being illustrated, each group comprises three discrete elements of different resistance or capacity values. Such element groups are formed in the substrate as will later be described in detail. A first resistor group 76 is connected to the power supply terminal V. A second resistor group 77 is for adjusting a driving level for the piezoelectric oscillation element 71. A first capacitor group 81 is connected to the piezoelectric element 71 in series for adjusting the frequency of oscillation. Second and third capacitor groups 82 and 83 are connected to a series connection of the piezoelectric oscillation element 71 and the first capacitor group 81 for selection in consideration of the constants (frequency and impedance) of the piezoelectric oscillation element 71. One of the elements in each of the resistor groups 76 and 77 and the capacitor groups 81 through 83 is selected by, for example, a switch 74 (FIG. 1). Except for the first resistor group 76, the selected elements form an optimally operable oscillation circuit together with the piezoelectric oscillation element 71, the transistor 72, the discrete resistors and capacitors, and the wiring conductors. One of the resistors of the first resistor group 76 is selected to make the power source supply a predetermined voltage to the oscillation circuit regardless of fluctuations in the power supply voltage.

The MMC substrate makes the oscillator compact. The oscillator being illustrated is only 1/5 to 1/10 in volume of a conventional oscillator. Inasmuch as the element groups are readily implemented in the substrate, it is unnecessary on adjusting the oscillator for optimum operation to substitute a new element for one already tried. This raises the reliability of operation without the troublesome adjustment.

Figure 4:
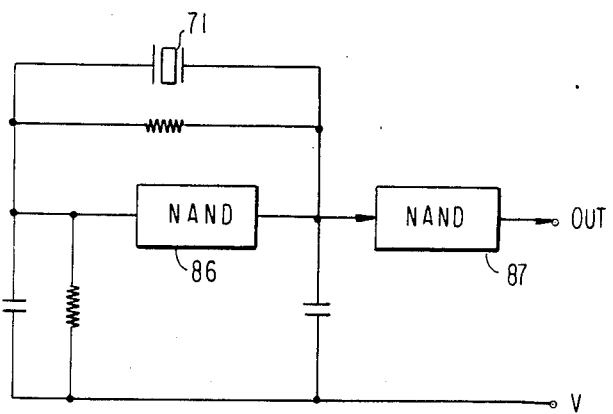
FIG. 4 is a block diagram of another piezoelectric oscillator which is manufactured by the use of an MMC substrate of the type illustrated in FIG. 1.

Turning to FIG. 4, a piezoelectric oscillator of a different type is conveniently manufactured by the use of an MMC substrate of the type so far described. The oscillator comprises a NAND circuit 86 instead of the transistor 72 described in conjunction with FIG. 3. Another NAND circuit 87 is used in deriving the oscillation output. The NAND circuits 86 and 87 will collectively be called an active semiconductor device. The piezoelectric oscillation element 71 and such an active semiconductor device are mounted on at least one of the principal surfaces of the substrate as indicated in FIG. 1 at 71 and 72. Two resistors and two capacitors are formed in the substrate together with the wiring conductors for providing the oscillation circuit in cooperation with the piezoelectric oscillation element 71 and the active semiconductor element.

Figure 5:
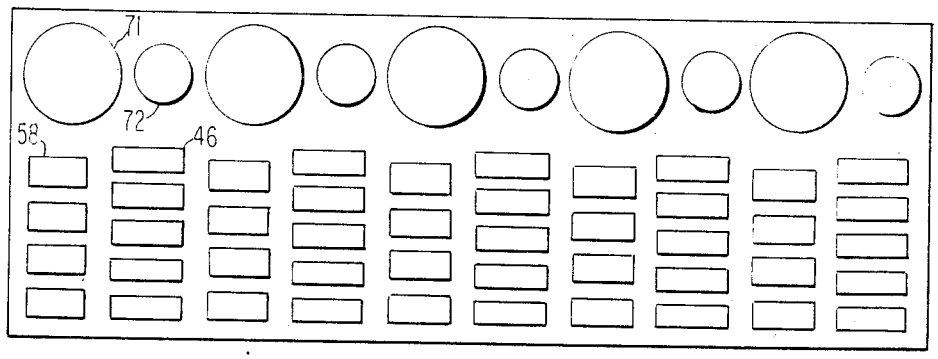
FIG. 5 is a top view of a conventional piezoelectric oscillator of a multi-frequency type.

Referring to FIG. 5, a conventional multi-frequency piezoelectric oscillator is for use as carrier generators in a communication device wherein a plurality of channels are used either concurrently or selectively. Piezoelectric oscillation elements, such as 71, have different characteristic or natural frequencies. An individual oscillation circuit is formed for each piezoelectric oscillation element by the use of a transistor 72, five resistors, such as 46, and four capacitors, such as 58. The piezoelectric oscillation elements and the transistors are mounted on a surface of a ceramic substrate together with the resistors, the capacitors, and the wiring therefor.

Figure 6:
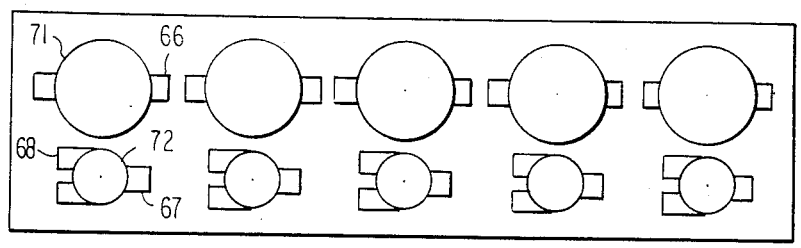
FIG. 6 is a schematic top view of a piezoelectric oscillator which corresponds to that depicted in FIG. 5 and comprises an MMC substrate of the type shown in FIG. 2.

Turning to FIG. 6, it is possible to provide such a multi-frequency oscillator by the use of an MMC substrate of the type described hereinabove. In the example being illustrated, the piezoelectric oscillation elements and the transistors are mounted on one of the principal surfaces of the substrate in electrical connection to terminal films, such as 66 through 68, formed thereon. Terminal films formed on the other of the principal surfaces, may be used as the output terminal, the grounding terminal, and the power supply terminal. It is to be pointed out in this connection that the thickness of the substrate is not much different from that of the ceramic substrate mentioned in connection with FIG. 5 even though various passive circuit components are formed therein.

Figure 7:
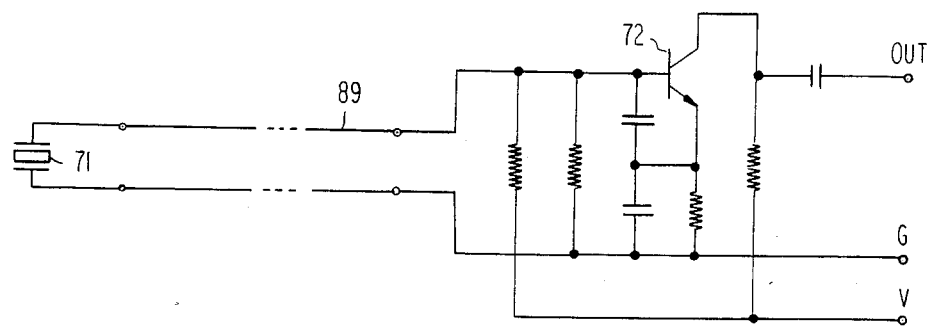
FIG. 7 is a circuit diagram of a conventional piezoelectric thermometer.

Referring to FIG. 7, a conventional piezoelectric thermometer comprises a piezoelectric oscillation element 71 as a temperature sensing head for use in measuring the temperature in air or in water. As compared with a platinum resistance theremometer or a thermistor thermometer, the piezoelectric thermometer is capable of precisely measuring the temperature and is adaptive to digital processing. The piezoelectric oscillation element 71 is, however, used in an oscillation circuit which includes a transistor 72 and a pair line 89. Although effective in reducing the size of the temperature sensing head, the pair line 89 is objectionable in that the length thereof and the spacing between conductors thereof are variable and result in a variation in the equivalent reactance component of the piezoelectric oscillation element 71. The variation renders the oscillation frequency unstable and in a variation in the temperature coefficient of the oscillation frequency, namely, the rate of variation of the oscillation frequency versus the temperature.

Turning to FIG. 8, a piezoelectric thermometer includes a temperature sensing head 91 which comprises a piezoelectric oscillator as will presently be described. In the example being illustrated, the head 91 is connected to a frequency divider 92 through a cable 93. The frequency of the oscillation generated by the piezoelectric oscillator of the head 91 is divided by the divider 93 and then counted by a counter 94, which makes a display unit 95 display the temperature.

Referring to FIGS. 9 and 10, the temperature sensing head 91 comprises an MMC substrate 96 of the type thus far described. The piezoelectric oscillation element 71 and the transistor 72 are mounted on at least one of the principal surfaces of the substrate 96 together with an additional transistor 97 to form a piezoelectric oscillator in a casing 98. The piezoelectric oscillation element 71 is partly exposed outwardly of the casing 98. The additional transistor 97 is for use in a buffer stage 99. The circuit depicted in FIG. 10 is formed in the substrate 96 except the piezoelectric oscillation element 71, the transistors 72 and 97, and the cable 93. The cable 93 comprises an output conductor OUT, a grounding conductor G, and a power supply conductor V. The buffer stage 99 is for preventing the distributed capacity and the like of the conductors OUT, G, and V from adversely affecting the oscillation frequency and the temperature coefficient of the oscillation frequency. Despite addition of the buffer stage 99, the substrate 96 renders the temperature sensing head 91 very compact. Incidentally, a connector 100 is for connection of the cable 93 to, for example, the frequency divider 92 depicted in FIG. 8.

Figure 11:
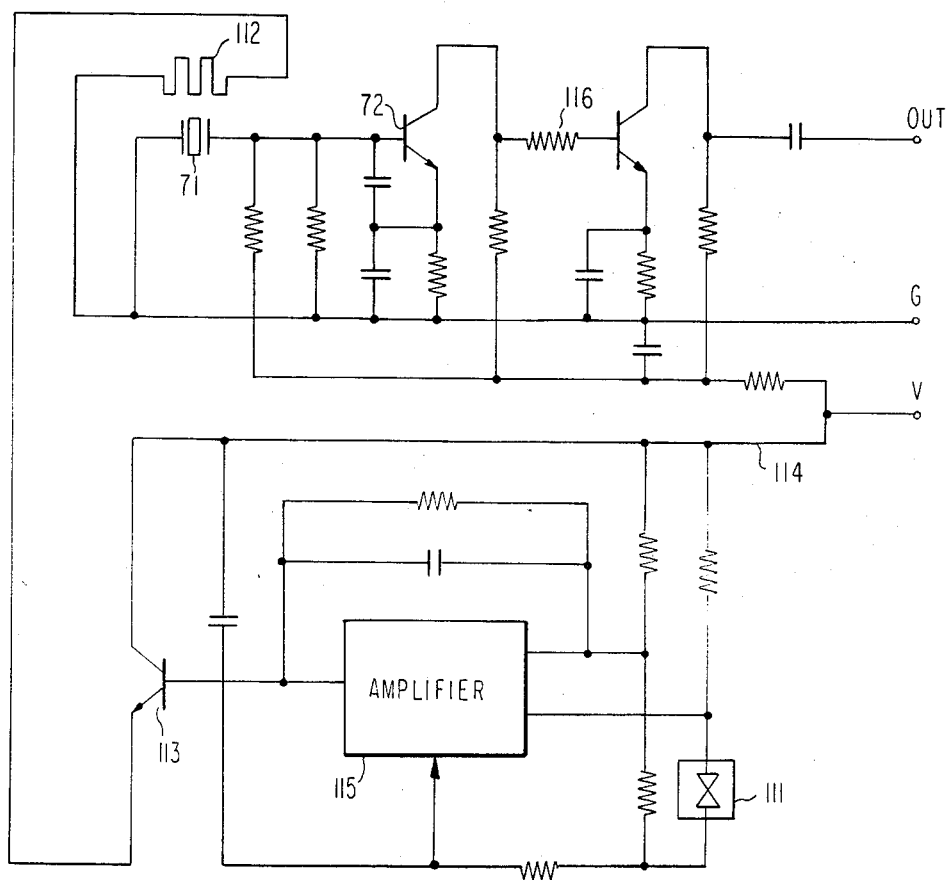
FIG. 11 is a block diagram of a piezoelectric oscillator which is accompanied by a thermostat and comprises an MMC substrate of the type exemplified in FIG. 1.

Referring to FIG. 11, a piezoelectric oscillator is accompanied by a heater resistor and is either embedded in a heat insulating mass (not shown) or placed in a vacuum flask (not shown). The oscillator comprises an MMC substrate of the type described hereinabove and a piezoelectric oscillation element 71, a transistor 72, a thermistor or a like temperature sensitive element 111 on at least one of the principal surface of the substrate. An additional resistive film 112 is formed on one of the principal surfaces, preferably adjacent to the piezoelectric oscillation element 71. The additional resistive film 112 is supplied with an electric current through a current controlling transistor 113 mounted on one of the principal surfaces and disposed in a branch 114 from the power supply terminal V. The temperature sensitive element 111 is accompanied by an amplifier 115 formed in the substrate except at least one transistor (not shown) mounted on the principal surface. Responsive to the ambient temperature sensed by the temperature sensitive element 111, the amplifier 115 controls the current controlling transistor 113. The additional resistive film 112 therefore serves as the above-mentioned heater resistor in keeping the piezoelectric oscillation element 71 and its adjacency at a predetermined temperature and thereby achieving a highly precise and accurate oscillation frequency. Incidentally, an additional transistor 116 is mounted on one of the principal surfaces for use in a power amplifying circuit for the oscillator output.

Figure 12:
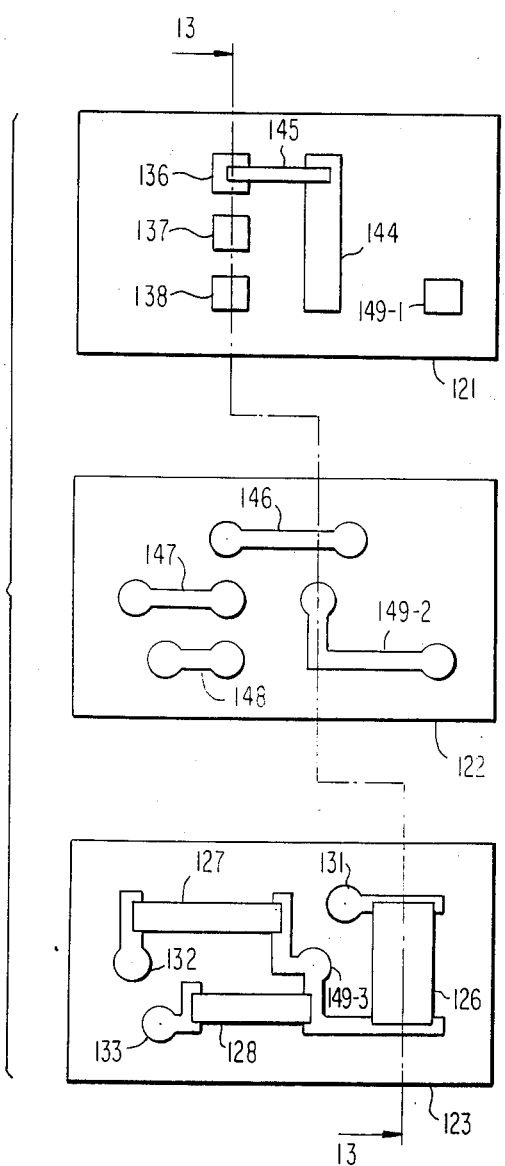
FIG. 12 schematically shows top views of three insulative layers of an MMC substrate of the type illustrated in FIG. 1.
Figure 13:
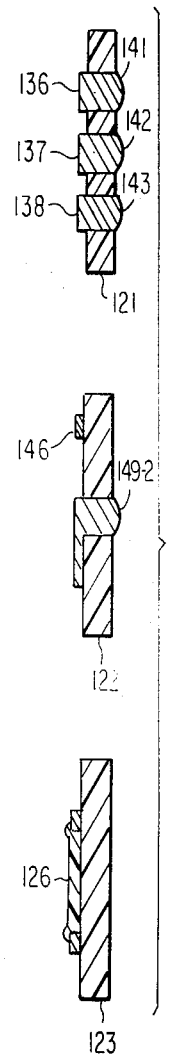
FIG. 13 schematically shows vertical sections taken along a line 13—13 drawn on FIG. 12.

Referring now to FIGS. 12 and 13, a first insulative layer 121 provides one of the principal surfaces of an MMC substrate of the type exemplified in FIGS. 1 or 2. For example, the first insulative layer 121 is one of the insulative layers 31 and 44 depicted in FIG. 1. Second and third insulative layers 122 and 123 are two or other insulative layers of the substrate.

A group of first insulative third discrete resistors 126, 127, and 128 are formed on the third insulative layer 123 for use as one of the resistor groups of the type described in connection with FIG. 3. Each of the resistors 126 through 128 has a first and a second end. The first ends of the resistors 126 through 128 are in electrical contact with first through third conductive films 131, 132, and 133 formed on the third insulative layer 123.

First through third predetermined terminal films 136, 137, and 138 of the terminal films formed on the principal surface of the first insulative layer 121, are accompanied by conductive masses 141, 142, and 143 formed through the first insulative layer 121, respectively, and are selectively connective to a particular terminal film 144 by a shunt conductor 145 which serves like the switch 74 (FIG. 1). By the aid of the conductive films 131 through 133 and the conductive masses 141 through 143, the first ends of the first through the third resistors 126 to 128 are connected to the first through the third predetermined terminal films 136 to 138 through first to third wiring conductors 146, 147, and 148, respectively, exemplified on the second insulative layer 122. The second ends of the resistors 126 through 128 are connected in common to a particular wiring conductor 149. The particular wiring conductor 149, as herein collectively called, is depicted in the example being illustrated as wiring conductors 149-1, 149-2, and 149-3 on the first through the third insulative layers 121 to 123, respectively.

Depending on the circumstances, some components of the particular wiring conductor 149, such as one 149-1 formed on and through the first insulative layer 121, may be dispensed with. Alternatively, the particular terminal film 174 may be accompanied by a conductive mass which is formed through the first insulative layer 121 in electrical contact with a conductive film (not shown) on the second insulative layer 122. In this event, the selected one of the resistors 126 through 128 is connected between that conductive film and the particular wiring conductor 149-2 formed on and through the second insulative layer 122. Incidentally, the first and the second ends of each resistor are so named merely for discrimination therebetween. The first ends of the respective resistors may therefore be connected in common to a wiring conductor and the second ends, to predetermined terminal films, respectively.

Figure 14:
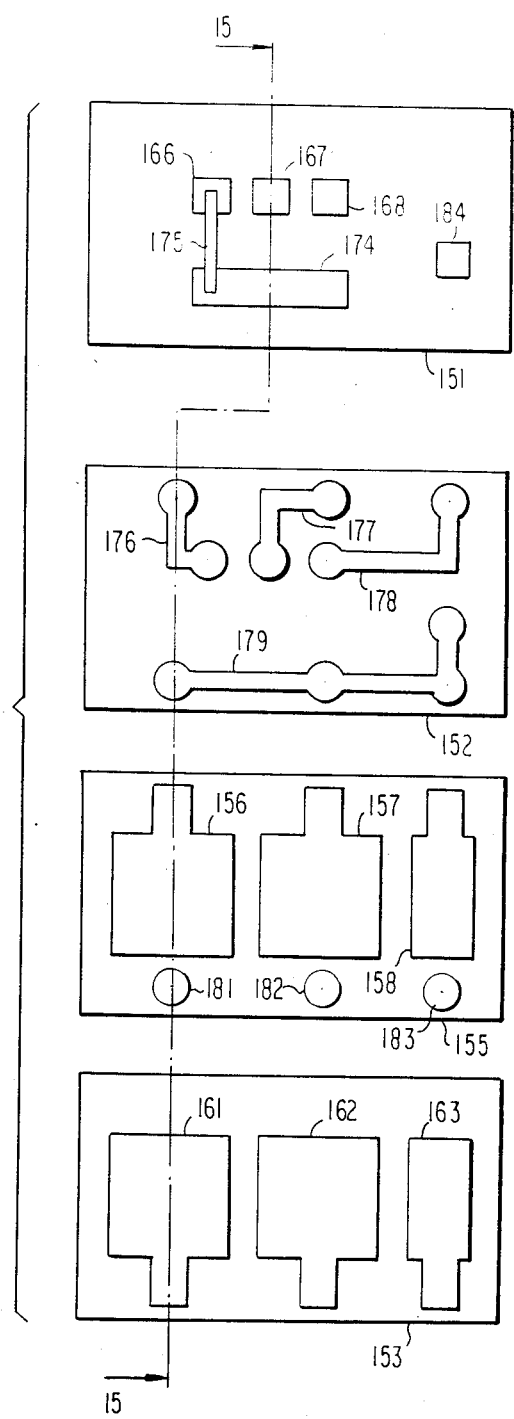
FIG. 14 schematically shows top views of three insulative layers and one dielectric layer of an MMC substrate of the type illustrated in FIG. 1.
Figure 15:
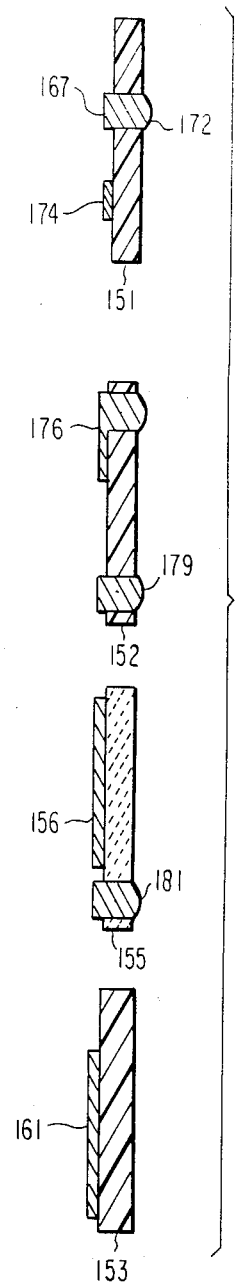
FIG. 15 schematically shows vertical sections taken on a line 15—15 depicted in FIG. 14.

Turning to FIGS. 14 and 15, a first insulative layer 151 provides one of the principal surfaces of an MMC substrate as the first insulative layer 121 described in conjunction with FIGS. 12 and 13 does. Merely for clarity of description, let the first insulative layer 151 be the first first-group insulative layer 31. Second and third insulative layers 152 and 153 are one of other first-group insulative layers 32 through 37 and the first second-group insulative layer 41. A dielectric layer 155 is the fourth dielectric layer 29. Alternatively, two successive ones of the dielectric layers 26 through 29 may be used instead of the dielectric and the third insulative layers 155 and 153.

A group of first through third discrete capacitors is formed in the substrate for use as one of the capacitor groups of the type described in connection with FIG. 3. Each capacitor comprises a first and a second conductive film on the dielectric and the third insulative layers 155 and 153, respectively. The first conductive films of the first through the third capacitors are depicted at 156, 157, and 158 and the second conductive films, at 161, 162, and 163.

First through third predetermined terminal films 166, 167, and 168 of the terminal films formed on the principal surface of the first insulative layer 151 are accompanied by conductive masses, such as 172, formed through the insulative layer 151 and are selectively connective to a particular terminal film 174 by a shunt conductor 175 which is similar to the conductor 145 (FIG. 13). Through the conductive masses, such as 172, the first through the third terminal films 166 to 168 are connected to first through third wiring conductors 176, 177, and 178 formed on and through the second insulative layer 152. The first through the third wiring conductors 176 to 178 are connected to the first conductive films 156 to 158 of the first through the third capacitors. The second conductive films 161 to 163 of the respective capacitors are connected to a particular wiring conductor 179 formed on and through the second insulative layer 152 via first through third wiring conductors 181, 182, and 183 formed on and through the dielectric layer 155. In the example being illustrated, a specific wiring conductor 184 is formed on and through the first insulative layer 151 for connection to the particular wiring conductor 179. Depending on the circumstances, the specific wiring conductor 184 may be dispensed with. Like the resistors illustrated with reference to FIGS. 12 and 13, the first and the second conductive films of each capacitor are so named merely for convenience of description.

Figure 16:
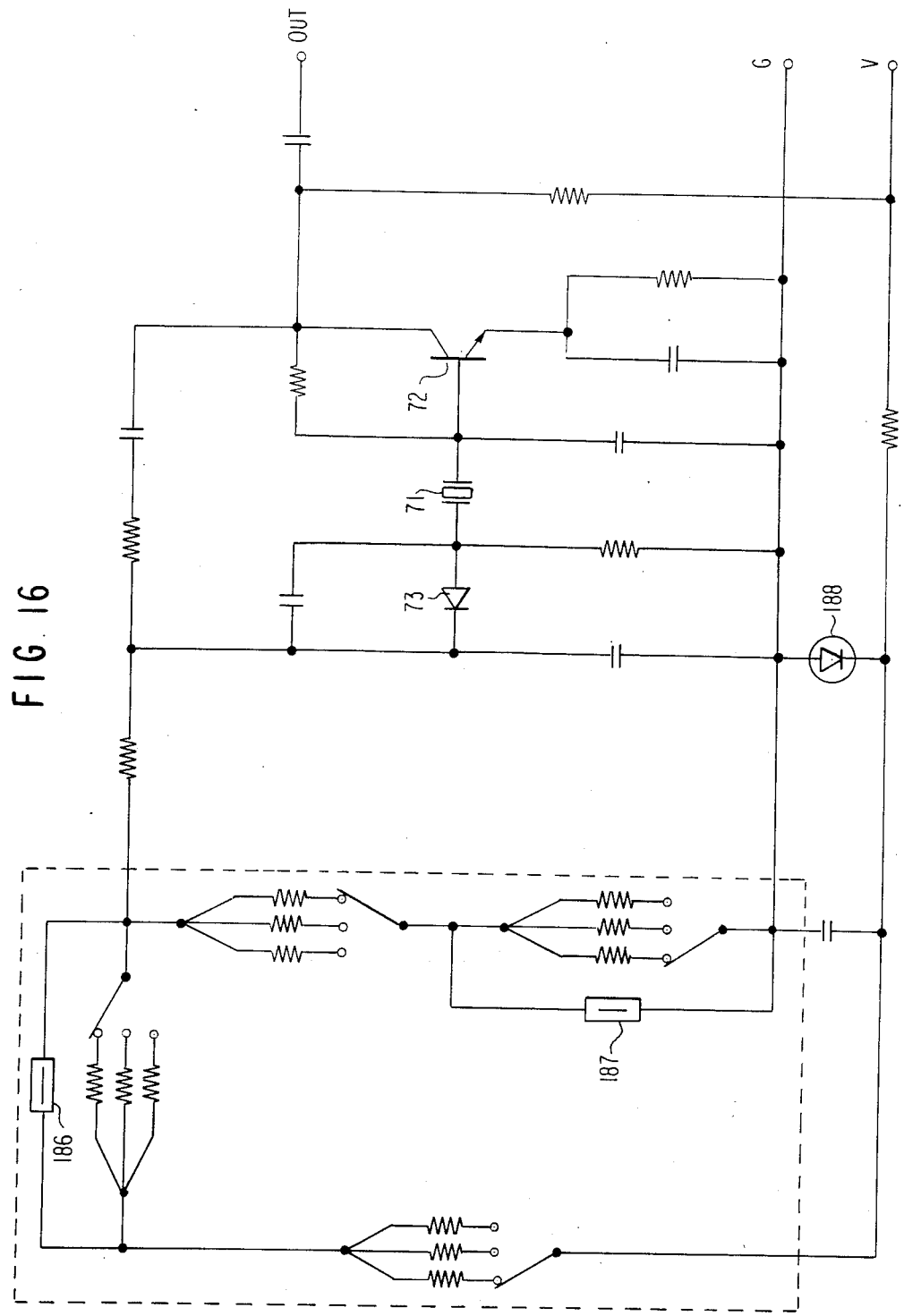
FIG. 16 is a circuit diagram of a piezoelectric oscillator which comprises a temperature compensation circuit and an MMC substrate including the three layers mentioned in connection with FIGS. 12 and 13.

Referring to FIG. 16, a temperature-compensated piezoelectric oscillator comprises an MMC substrate of the type so far described and a piezoelectric oscillation element 71, a transistor 72, a diode 73, first and second temperature sensitive resistors 186 and 187, and an additional diode 188 on at least one of the principal surfaces of the substrate. Each of the temperature sensitive resistors 186 and 187 is connected parallel to a resistor group so as to form a temperature compensation circuit as illustrated in a dashed-line rectangle. More specifically, each of the temperature sensitive resistors 186 and 187 has a first and a second end connected on the principal surface to the particular terminal film and the particular wiring conductor, such as 144 and 149 (FIGS. 12 and 13) of a resistor group. The resistors of the respective groups are individually selected in compliance with the temperature-frequency characteristics of the piezoelectric oscillation element 71.

Figure 17:
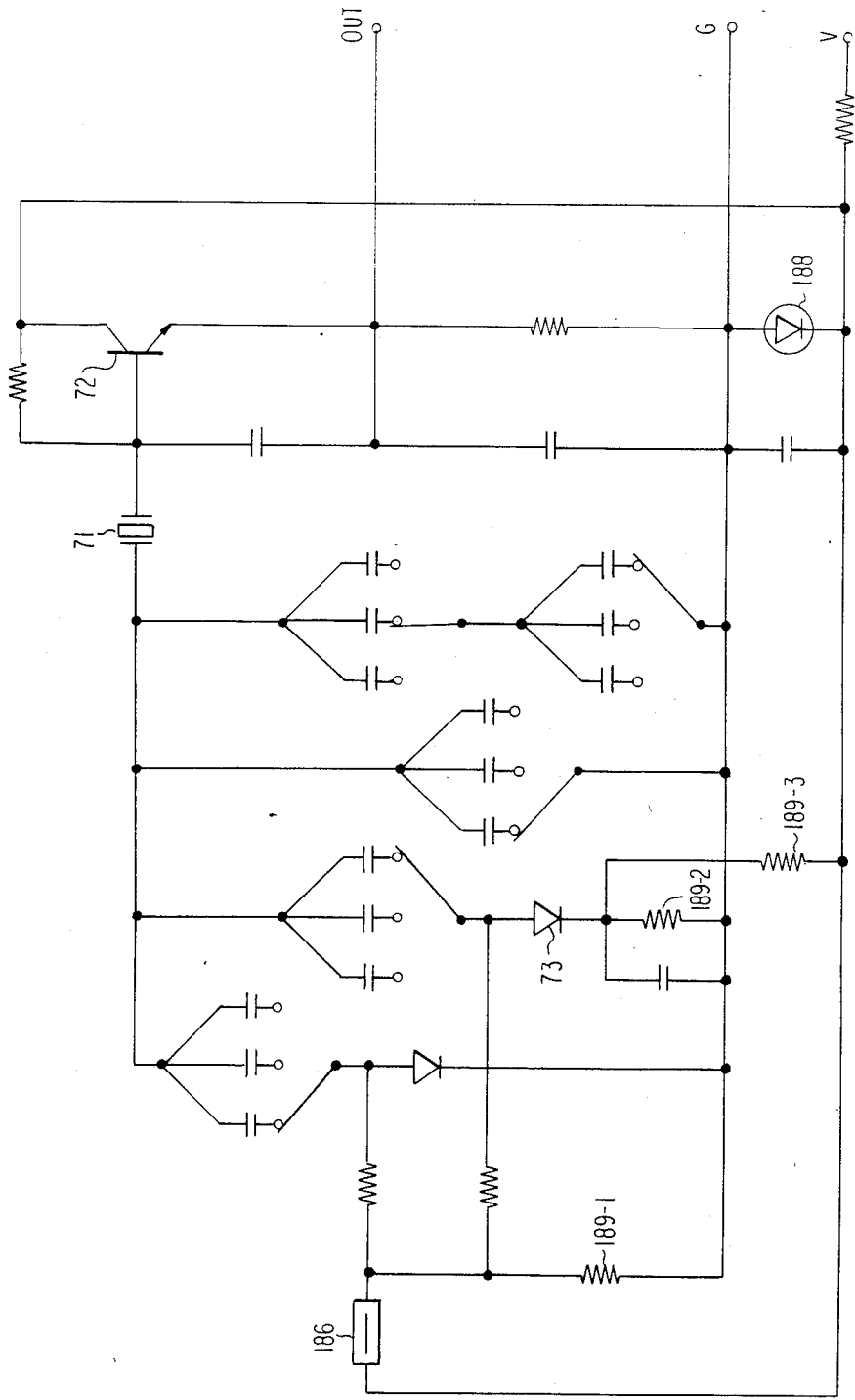
FIG. 17 is a circuit diagram of a piezoelectric oscillator which comprises a temperature compensation circuit and an MMC substrate including the four layers mentioned in conjunction with FIGS. 14 and 15.

Turning to FIG. 17, another temperature-compensated piezoelectric oscillator comprises similar parts designated by like reference numerals. Capacitor groups are substituted for the resistor groups described with reference to FIG. 16. A single temperature sensitive resistor 186 has a first and a second end connected to both ends of at least one resistor, such as 189-1, 189-2, and 189-3. The capacitors of the respective groups are individually selected in accordance with the temperature-frequency characteristics of the piezoelectric oscillation element 71.

Figure 18:
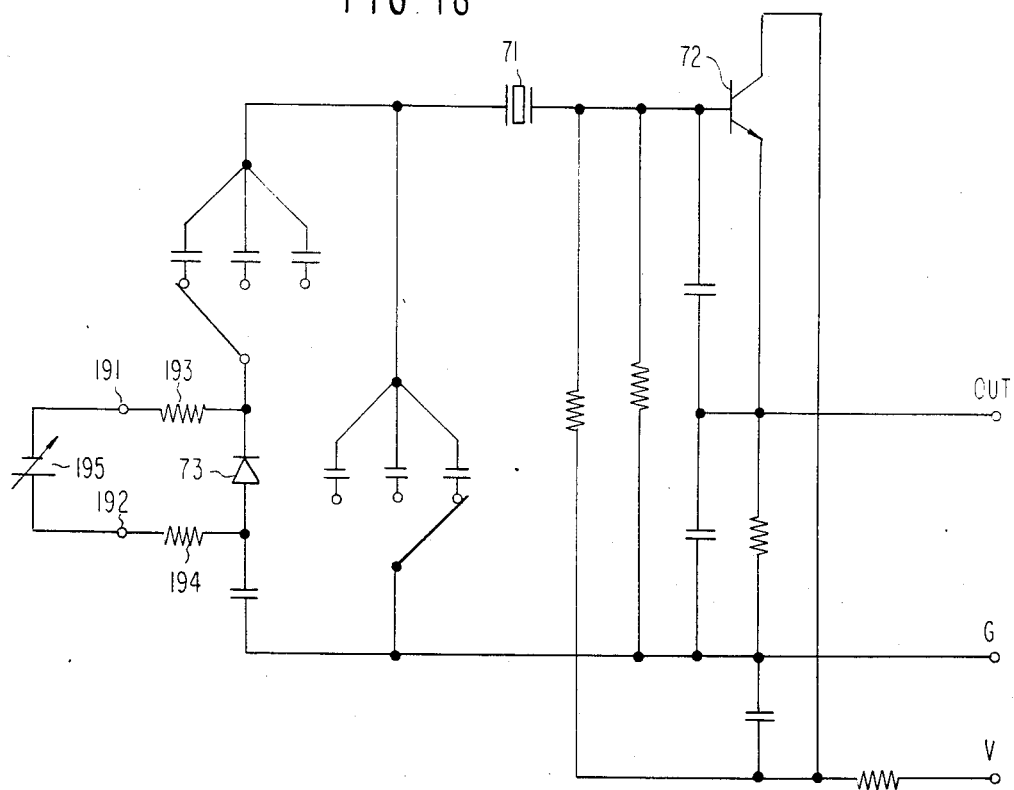
FIG. 18 is a circuit diagram of a piezoelectric oscillator which is of a voltage controlled type and comprises an MMC substrate of the type illustrated in FIG. 1.

Referring to FIG. 18, a voltage-controlled piezoelectric oscillator comprises an MMC substrate of the type exemplified with reference to FIGS. 1 and 2 and a piezoelectric oscillation element 71, a transistor 72, and a diode 73 on at least one of the principal surfaces of the substrate. The diode 73 is used as a part of the load capacitors of the piezoelectric oscillation element 71 and serves as a variable reactance element controlled by a control voltage. In the example being illustrated, the diode 73 has an anode connected to one of the conductive films of a capacitor and a cathode connected to a predetermined one of the particular terminal film and wiring conductor, such as 174 and 179 (FIGS. 14 and 15).

First and second electrode films 191 and 192 formed preferably on a single one of the principal surfaces, are connected across the diode 73 through a pair of resistors 193 and 194. The first and the second terminal films 191 and 192 are for connection across a source of the control voltage which is depicted as an adjustable battery 195 and delivers the control voltage to the diode 73 through the resistors 193 and 194. Inasmuch as fluctuations are unavoidable in the characteristics of the piezoelectric oscillation element 71 and the diode 73, fluctuations are inevitable in the relationships between the diode impedance, the control voltage, the load capacitance, and the oscillation frequency. Capacitors, such as 196, 197, and 198, of the illustrated capacitor groups are individually selected in compensation for such fluctuations.

Figure 19:
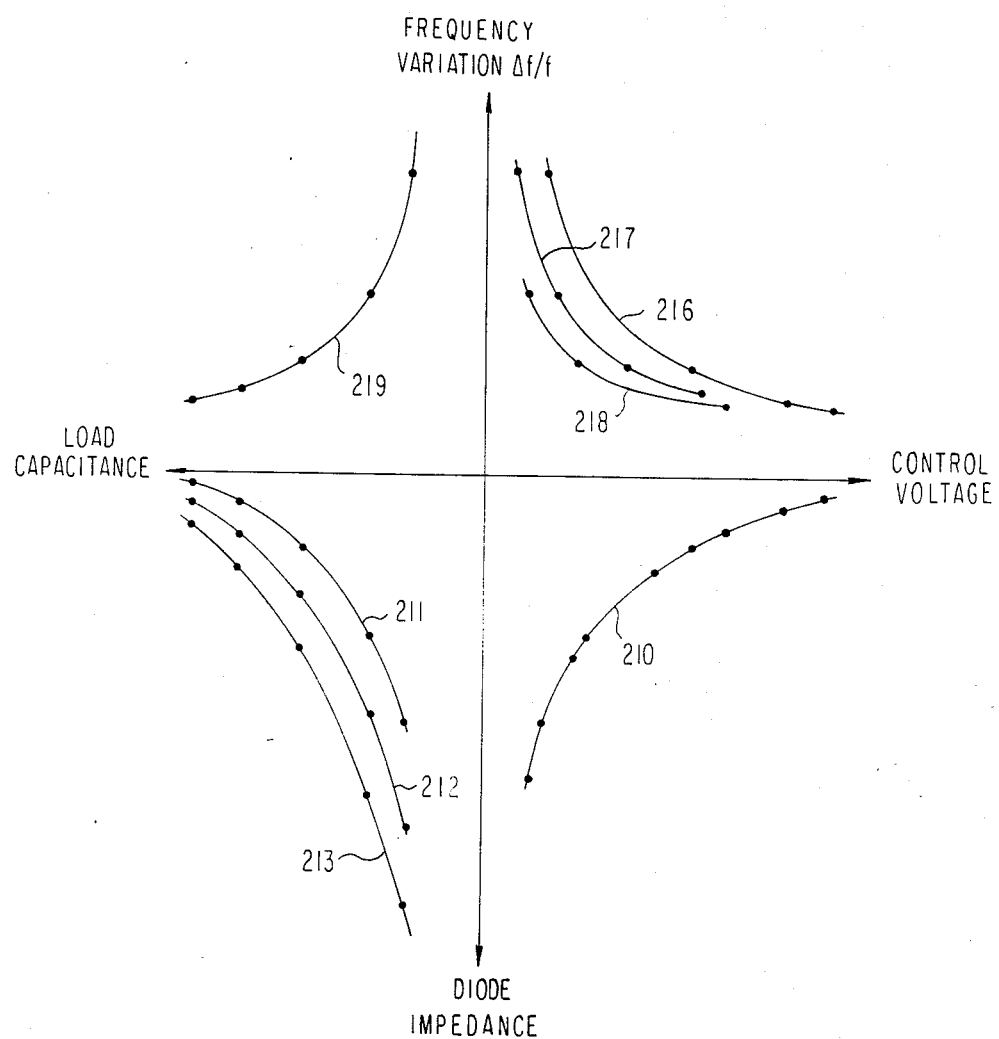
FIG. 19 is a diagram illustrative of characteristics of a piezoelectric oscillator of the type shown in FIG. 18.

Turning to FIG. 19, the diode impedance of a diode 73 varies with the control voltage as depicted by a curve 210. When the capacitors 196 through 198 are selected, the load capacitance varies as shown by curves 211, 212, and 213, respectively. The frequency variation f/f varies as indicated by curves 216, 217, and 218, respectively. The relationship between the load capacitance and the frequency variation is illustrated by a curve 219.

Figure 20:
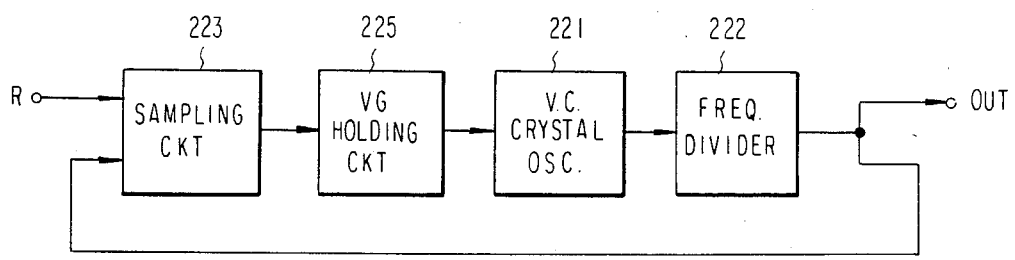
FIG. 20 is a block diagram of a piezoelectric oscillator of an automatic phase control type.

Referring to FIG. 20, a phase-controlled piezoelectric oscillator comprises a voltage controlled piezoelectric oscillator 221 (labelled v.c. crystal osc.) of the type described heretobefore with reference to FIGS. 18 and 19. The oscillation thereby generated is, however, not directly delivered to outside. The oscillation is frequency divided by a frequency divider 222 implemented in the MMC substrate of the piezoelectric oscillator 221 insofar as the resistors, capacitors, and wiring conductors are concerned. It is to be noted in this connection that the frequency divider 92 described in conjunction with FIG. 8 is not integral with the piezoelectric oscillator used as the temperature sensing head 91.

The frequency divided output is sent to a sampling circuit 223 and sampled by a phase reference signal R supplied thereto from outside. In other words, the sampling circuit 223 is for comparing the phase of the frequency divided output with that of the phase reference signal R. The sampling circuit 223 produces a phase error signal of a level representative of a phase error between the frequency divided output and the phase reference signal R. The phase error signal is held in a voltage holding circuit 225 and fed thence back to the piezoelectric oscillator 221. Controlled by the phase error signal, the piezoelectric oscillator 221 makes the frequency divider 222 produce the frequency divided output as a desired output signal OUT. The voltage holding circuit 225 is composed essentially of a low-pass filter comprising a resistor and two capacitors as will shortly be described. The sampling and the voltage holding circuits 223 and 225 are formed integral with the piezoelectric oscillator 221 with the MMC substrate used in common.

As described above, the piezoelectric oscillator 221 comprises a piezoelectric oscillation element which may have fluctuations in the characteristics between the oscillation frequency and the temperature. The phase reference signal R may also have a fluctuating level to give rise to a fluctuation in the level of the phase error signal. It is therefore necessary to adjust the constants of the resistor and the capacitors of the voltage holding circuit 225 in order to cope with the fluctuations and to provide a phase controlled oscillator of a wide range of phase control.

Figure 21:
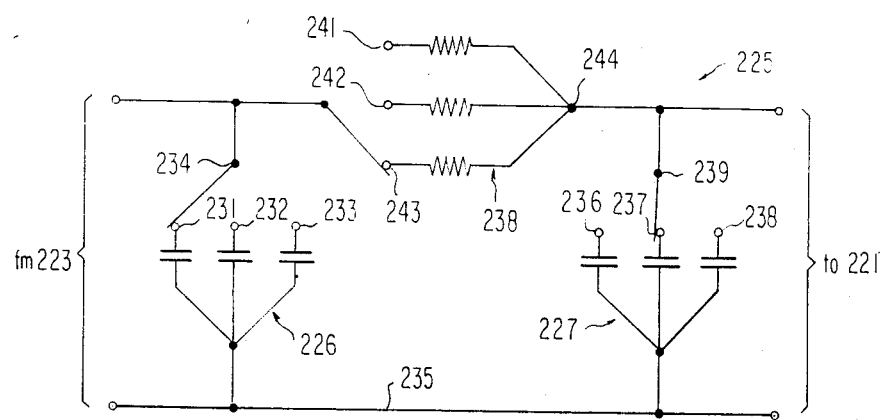
FIG. 21 is a circuit diagram of a part of the piezoelectric oscillator which is of the type depicted in FIG. 20 and comprises an MMC substrate of the type shown in FIG. 1.

Turning to FIG. 21, the voltage holding circuit 225 comprises first and second capacitor groups 226 and 227 and a resistor group 228. As illustrated with reference to FIGS. 14 and 15, first conductive films of the capacitors of the group 226 are connected to predetermined terminal films 231, 232, and 233, respectively. The terminal films 231 to 233 are selectively connective to a particular terminal film 234 by, for example, a switch 74 (FIG. 1). Second conductive films of the capacitors are connected in common to a particular wiring conductor 235. First conductive films of the capacitors of the group 227 are connected to preselected terminal films 236, 237, and 238. The preselected terminal films 236 to 238 are selectively connective to a specific terminal film 239. Second conductive films of the capacitors are connected in common to the particular wiring conductor 239. As illustrated with reference to FIGS. 12 and 13, first ends of the resistors of the group 238 are connected to prescribed terminal films 241, 242, and 243. The prescribed terminal films 241 to 243 are selectively connective to the particular terminal film 234. Second ends of the resistors are connected to common to a prescribed wiring conductor 244, which is connected to the specific terminal film 239.

The prescribed terminal films 241 to 243 may selectively be connective to a prescribed one of the terminal films rather than to the particular terminal film 234. The second conductive films of the capacitors of the second group 237 may be connected in common to a specific wiring conductor, which is different from the particular wiring conductor 235. The prescribed terminal film may be connected to one of the particular and the specific terminal films 234 and 239. Alternatively, the prescribed terminal film may be connected to one of the particular wiring conductor 235 and the specific wiring conductor. It is possible in this manner to form an equivalent or a similar circuit.

Figure 22:
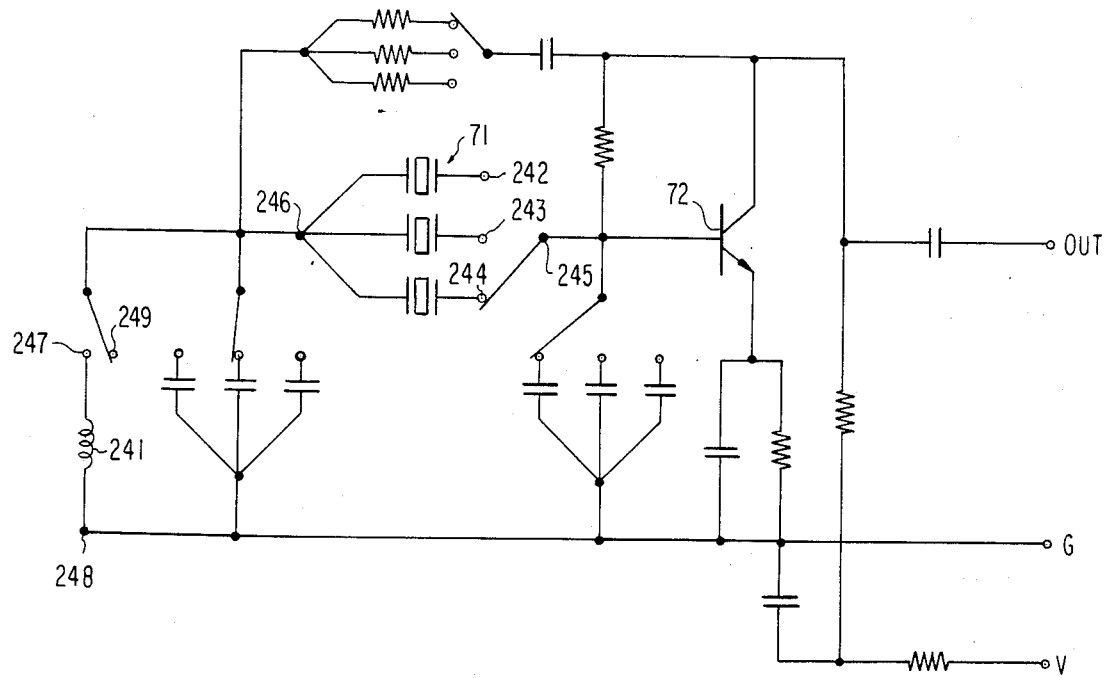
FIG. 22 is a circuit diagram of a piezoelectric oscillator which is of a wide frequency type and comprises an MMC substrate of the type exemplified in FIG. 1.

Finally referring to FIG. 22, attention will be directed to a piezoelectric oscillator capable of generating oscillation of a frequency which is selected from a wide frequency band including the fundamental frequency and third, fifth, and like higher harmonics. An inductor 241 is ordinarily used in making the oscillator generate one of the higher harmonics. In this event, capacitors and resistors must be changed to optimum ones. In a conventional piezoelectric oscillator of this type, undesirable ones of the capacitors and/or the resistors must be removed from the printed circuit and by anew installing more preferred ones on the printed circuit. This is troublesome and time consuming. Like disadvantages have been unavoidable in a wide band piezoelectric oscillator comprising a plurality of piezoelectric oscillation elements, one of which is selected to generate oscillation of a desired frequency.

The oscillator depicted in FIG. 22 comprises an MMC substrate of the type so far described and a plurality of piezoelectric oscillation elements, collectively indicated at 71, a transistor 72, a switch 74 (FIG. 1), and the inductor 241 on at least one of the principal surfaces of the substrate. The piezoelectric oscillation elements 71 have different characteristic or natural frequencies. Each piezoelectric oscillation element comprises a first and a second electrode. The first electrodes of the respective piezoelectric oscillation elements 71 are connected to predetermined terminal films 242, 243, and 244, respectively. The predetermined terminal films 242 to 244 are selectively connective by the switch 74 to a particular terminal film 245. The second electrodes of the piezoelectric oscillation elements 71 are connected in common to a specific terminal film 246. The inductor 241 has a first end connected to a preselected terminal film 247 and a second end connected to a particular terminal film 248. The switch 74 is capable of selectively connecting and disconnecting the preselected terminal film 247 to a prescribed one of the terminal films that is indicated at 249.

A plurality of oscillation circuits are formed by the respective piezoelectric oscillation elements 71 in combination with the transistor 72, discrete capacitors and resistors, selected ones of capacitors and resistors of the respective groups, and the wiring conductors. The switch 74 is capable of putting a selected one of the oscillation circuits into operation either together with the inductor 241 or without the same. On making a selected one of the oscillation circuits generate oscillation of the fundamental frequency, the inductor 241 is disconnected from the prescribed terminal film 249. On making the selected oscillation circuit generate one of the higher harmonics, the inductor 241 is connected to the prescribed terminal film 249.

While this invention has thus far been described in specific conjunction with a few embodiments thereof and applications thereof to piezoelectric oscillators, it will now readily be possible for one skilled in the art to apply a MMC substrate according to this invention, to manufacture of other devices. The MMC substrate has a wide flexibility. This gives an equally wide flexibility to the device, such as each of the above-exemplified piezoelectric oscillators, which comprises an MMC substrate according to this invention. Incidentally, the switch 74 may comprise a plurality of individually operable shunt bars or conductive bars, such as 145 or 175, as would have been understood from the above.

What is claimed is:

1. In a monolithic multicomponents ceramic (MMC) substrate comprising at least one dielectric layer which is of at least one composition having a perovskite structure, a plurality of insulative layers on both sides of said at least one dielectric layer, a plurality of resistive films on at least one of said dielectric and said insulative layers, said resistive films being resistors, a plurality of pairs of conductive films on both sides of at least one of said at least one dielectric layer, said pairs of conductive films being capacitors, and a plurality of wiring conductors on and through predetermined ones of said dielectric and said insulative layers to form an electrical circuit together with said resistive films and said pairs.

2. An MMC substrate as claimed in claim 1, wherein said insulative layers are of at least one material which is fired toegther with said at least one composition at a temperature selected between 850° C. and 1050° C.

3. An MMC substrate as claimed in claim 2, wherein said composition comprises, ferric oxide, niobium oxide, and tungsten oxide and is fired at a temperature which is not higher than 950° C.

4. An MMC substrate as claimed in claim 3, wherein said composition is of a chemical formula of $Pb[(Fe_{2/3}.W_{1/3})_{0.33}(Fe_{1/2}.Nb_{1/2})_{0.67}]O_3$ and is fired at about 950° C.

5. An MMC substrate as claimed in claim 3, wherein said composition is of a chemical formula of $Pb[(Fe_{2/3}.W_{1/3})_{0.36}(Fe_{1/2}.Nb_{1/2})_{0.48}(Zn_{1/3}.Nb_{2/3})_{0.16}]O_3$ and is fired at about 890° C.

6. An MMC substrate as claimed in claim 3, wherein said composition is of a chemical formula of $Pb[(Fe_{2/3}.W_{1/3})_{0.85}(Mn_{1/3}.Nb_{2/3})_{0.03}Ti_{0.12}]O_3$ and is fired at about 920° C.

7. An MMC substrate as claimed in claim 2, wherein said composition comprises manganese oxide, niobium oxide, magnesium oxide, titanium oxide, and at least one of tungsten oxide and nickel oxide and is fired at a temperature which is not higher than 1050° C.

8. An MMC substrate as claimed in claim 7, wherein said composition is of a chemical formula of $Pb[(Mn_{1/3}.Nb_{2/3})_{0.01}(Mg_{1/3}.Nb_{2/3})_{0.30}(Ni_{1/3}.Nb_{2/3})_{0.49}Ti_{0.20}]O_3$ and is fired at about 1050° C.

9. An MMC substrate as claimed in claim 7, wherein said composition is of a chemical formula of $Pb[(Mn_{1/3}.Nb_{2/3})_{0.005}(Ni_{1/3}.Nb_{2/3})_{0.295}(Mg_{1/2}.W_{1/2})_{0.29}Ti_{0.41}]O_3$ and is fired at about 960° C.

10. An MMC substrate as claimed in claim 7, wherein said composition is of a chemical formula of $Pb[(Mn_{1/3}.Nb_{2/3})_{0.02}(Mg_{1/2}.W_{1/2})_{0.52}Ti_{0.23}Zr_{0.23}]O_3$ and is fired at about 1000° C.

11. An MMC substrate as claimed in claim 2, wherein said composition comprises magnesium oxide, tungsten oxide, and titanium oxide and is fired at a temperature which is not higher than 1000° C.

12. An MMC substrate as claimed in claim 11, wherein said composition is of a chemical formula of $Pb[(Mg_{1/2}.W_{1/2})_{0.66}Ti_{0.34}]O_3$ and is fired at about 900° C.

13. An MMC substrate as claimed in claim 11, wherein said composition is of a chemical formula of $Pb[(Mg_{1/2}.W_{1/2})_{0.65}(Mn_{1/3}.Nb_{2/3})_{0.01}Ti_{0.34}]O_3$ and is fired at about 900° C.

14. An MMC substrate as claimed in claim 11, wherein said composition is of a chemical formula of $Pb[(Mg_{1/2}.W_{1/2})_{0.54}Ti_{0.23}Zr_{0.23}]O_3$ and is fired at about 1000° C.

15. An MMC substrate as claimed in claim 11, wherein said composition is of a chemical formula of $Pb[(Mg_{1/2}.W_{1/2})_{0.24}(Ni_{1/3}.Nb_{2/3})_{0.40}Ti_{0.36}]O_3$ and is fired at about 990° C.

16. An MMC substrate as claimed in claim 2, wherein said at least one dielectric layer comprises a first dielectric layer of a predetermined dielectric constant and a second dielectric layer of a dielectric constant which is different from said predetermined dielectric constant.

17. An MMC substrate as claimed in claim 2, wherein said at least one material consists essentially of aluminium oxide and lead borosilicate glass, said aluminium oxide and said lead borosilicate glass being in those constituent ranges of 40 to 60 percent and 40 to 60 percent, respectively, which is selected to become 100 percent in total, said percentages being by weight.

18. An MMC substrate as claimed in claim 17, wherein said lead borosilicate glass consists essentially of, when represented by oxides, lead oxide, boron oxide, silicon dioxide, at least one oxide of elements of Group II, and at least one oxide of elements of Group IV except carbon, silicon, and lead in those constituent ranges of 3 to 65 percent, 2 to 50 percent, 4 to 65 percent, 0.1 to 50 percent, and 0.02 to 20 percent, respectively, which are selected to become 100 percent in total, all percentages being by weight.

19. An MMC substrate as claimed in claim 2, wherein each resistive film is a fired resistive paste film.

20. An MMC substrate as claimed in claim 2, wherein each resistive film has a composition comprising ruthenium dioxide and lead borosilicate glass in a composition ratio which is selected from ranges between 10:90 and 50:50 by weight.

21. An MMC substrate as claimed in claim 20, wherein said lead borosilicate glass consists essentially of, when represented by oxides, lead oxide, boron oxide, silicon dioxide, at least one oxide of elements of Group II, and at least one oxide of elements of Group IV except carbon, silicon, and lead in those constituent ranges of 3 to 65 percent, 2 to 50 percent, 4 to 65 percent, 0.1 to 50 percent, and 0.02 to 20 percent, respectively, which are selected to become 100 percent in total, all percentages being by weight.

22. An MMC substrate as claimed in claim 2, wherein each conductive film is a fired conductive paste film.

23. An MMC substrate as claimed in claim 2, wherein each wiring conductor comprises a fired conductive paste film on one of said predetermined ones of the dielectric and the insulative layers.

24. An MMC substrate as claimed in claim 2, wherein each wiring conductor comprises a fired conductive paste mass in a via hole preliminarily formed through one of said predetermined ones of the dielectric and the insulative layers.

25. In a piezoelectric oscillator comprising a monolithic multicomponents ceramic substrate having a pair of principal surfaces, and a piezoelectric oscillation element and an active semiconductor device on at least one of said principal surfaces, said substrate comprising at least one dielectric layer which is of at least one composition having a perovskite structure, a plurality of insulative layers on both sides of said at least one dielectric layer, a plurality of resistive films on at least one of said dielectric and said insulative layers, said resistive films being resistors, a plurality of pairs of conductive films on both sides of at least one of said at least one dielectric layer, said pairs of conductive films being capacitors, and a plurality of wiring conductors on and through predetermined ones of said dielectric and said insulative layers to form an oscillation circuit together with said piezoelectric oscillation element, said active semiconductor device, said resistive films, and said pairs, two of said insulative layers providing said principal surfaces, respectively.

26. A piezoelectric oscillator as claimed in claim 25, wherein said active semiconductor device comprises a transistor.

27. A piezoelectric oscillator as claimed in claim 25, wherein said active semiconductor device comprises a NAND circuit.

28. A piezoelectric oscillator as claimed in claim 25, said oscillation circuit being for generating oscillation of a first frequency, said oscillator further comprising an additional piezoelectric oscillation element and an additional active semiconductor device on at least one of said principal surfaces to form an additional oscillation circuit together with those of said resistive fims, said pairs, and said wiring conductors which are not used in the oscillation circuit of said first frequency, said additional oscillation circuit being for generating oscillation of a second frequency which is different from said first frequency.

29. A piezoelectric oscillator as claimed in claim 25 and for use as a temperature sensing head of a thermometer.

30. A piezoelectric oscillator as claimed in claim 25, said substrate further comprising an additional resistive film on one of said two of the insulative films, said oscillator further comprising a temperature sensitive element on one of said principal surfaces and a current supply means for supplying an electric current to said additional resistive film, said temperature sensitive element being connected by predetermined two of said wiring conductors to said additional resistive film and said current supply means so as to control said electric current.

31. A piezoelectric oscillatric oscillator as claimed in claim 25, said substrate further comprising a plurality of terminal films on at least one of said principal surfaces so that predetermined ones of said terminal films can selectively be connected to a particular one thereof by a conductive bar, each resistive film having a first and a second end, predetermined ones of said wiring conductors connecting the first ends of predetermined ones of said resistive films to said predetermined ones of the terminal films, respectively, the second ends of said predetermined ones of the resistive films being connected in common to a particular one of said wiring conductors, one of said predetermined ones of the resistive films that is connected to said particular one of the terminal films by said conductive bar being used in said oscillation circuit.

32. A piezoelectric oscillator as claimed in claim 31, further comprising a temperature sensitive resistor on one of said principal surfaces and in electrical contact with said particular ones of the terminal films and the wiring conductors.

33. A piezoelectric oscillator as claimed in claim 25, said substrate further comprising a plurality of terminal films on at least one of said principal surfaces so that predetermined ones of said terminal films can selectively be connected to a particular one thereof by a conductive bar, each pair consisting of a first and a second conductive film, predetermined ones of said wiring conductors connecting the first conductive films of predetermined ones of said pairs to said predetermined ones of the terminal films, respectively, the second ends of said predetermined ones of the pairs being connected in common to a particular one of said wiring conductors, one of said predetermined ones of the pairs that includes the first conductive film connected to said particular one of the terminal films by said conductive bar being used in said oscillation circuit.

34. A piezoelectric oscillator as claimed in claim 33, further comprising a temperature senstive resistor on one of said principal surfaces and in electrical contact with those two of said wiring conductors which are connected to both ends of at least one of said resistive films.

35. A piezoelectric oscillator as claimed in claim 33, further comprising a variable reactance element on one of said principal surfaces and in electrical contact with a predetermined one of said particular one of the terminal films and the wiring conductors and with a predetermined one of said first and said second conductive films of one of said pairs that is other than said predetermined ones of the pairs.

36. A piezoelectric oscillator as claimed in claim 25, further comprising a plurality of terminal films and a switch on at least one of said principal surfaces, predetermined ones of said terminal films capable of being selectively connected to a particular one thereof by said switch, preselected ones of said terminal films capable of being selectively connected to a specific one thereof by said switch, prescribed ones of said terminal films capable of being selectively connected to one of said particular and said specific ones of the terminal films by said switch, each resistive film having a first and a second end, each pair consisting of a first and a second conductive films, predetermined ones of said wiring conductors connecting the first conductive films of predetermined ones of said pairs to said predetermined ones of the terminal films, respectively, the second conductive films of said predetermined ones of the pairs being connected in common to a particular one of said wiring conductors, preselected ones of said wiring conductors connecting the first conductive films of predetermined ones of said pairs to said preselected ones of the terminal films, respectively, the second conductive films of said preselected ones of the pairs being connecting in common to a specific one of said wiring conductors, prescribed ones of said wiring conductors connecting the first ends of prescribed ones of said resistive films to said prescribed ones of the terminal films, respectively, the second ends of said prescribed ones of the resistive films being connected in common to a prescribed one of said wiring conductors, those of said pairs and said resistive films which are connected to said particular and said specific ones of the terminal films by said switch being used in said oscillation circuit.

37. In a piezoelectric oscillator comprising a monolithic multicomponents ceramic substrate having a pair of principal surfaces and a piezoelectric oscillation element, an active semiconductor device, an inductor, and a switch on at least one of said principal surfaces, said substrate comprising at least one dielectric layer which is of at least one composition having a perovskite structure, a plurality of insulative layers on both sides of said at least one dielectric layer, a plurality of resistive films on at least one of said dielectric and said insulative layers, said resistive films being resistors, a plurality of pairs of conductive films on both sides of at least one of said at least one dielectric layer, said pairs of conductive films being capacitors, and a plurality of wiring conductors on and through predetermined ones of said dielectric and said insulative layers so that said wiring conductors form a first oscillation circuit together with said piezoelectric oscillation element, said active semiconductor device, said switch, said resistive films, and said pairs and that said wiring conductors form a second oscillation circuit together with said piezoelectric oscillation element, said active semiconductor device, said inductor, said switch, said resistive films, and said pairs, two of said insulative layers providing said principal surfaces, respectively, said switch being for selectively putting said first and said second oscillation circuits into operation.

* * * * *